United States Patent
Nakayama

(10) Patent No.: US 10,809,137 B2
(45) Date of Patent: Oct. 20, 2020

(54) METHOD OF ESTIMATING TEMPERATURE OF REACTOR

(71) Applicant: DENSO CORPORATION, Kariya, Aichi-Pref (JP)

(72) Inventor: Wataru Nakayama, Nisshin (JP)

(73) Assignee: DENSO CORPORATION, Kariya (JP)

( * ) Notice: Subject to any disclaimer, the term of this patent is extended or adjusted under 35 U.S.C. 154(b) by 267 days.

(21) Appl. No.: 16/043,762

(22) Filed: Jul. 24, 2018

(65) Prior Publication Data
US 2019/0078943 A1    Mar. 14, 2019

(30) Foreign Application Priority Data

Sep. 14, 2017 (JP) ................. 2017-176821

(51) Int. Cl.
| | | |
|---|---|---|
| *G01K 7/42* | (2006.01) | |
| *B60L 3/00* | (2019.01) | |
| *B60L 3/12* | (2006.01) | |
| *B60L 58/12* | (2019.01) | |
| *G01R 31/382* | (2019.01) | |

(52) U.S. Cl.
CPC ............. *G01K 7/42* (2013.01); *B60L 3/0046* (2013.01); *B60L 3/12* (2013.01); *B60L 58/12* (2019.02); *G01K 7/427* (2013.01); *B60L 2240/545* (2013.01); *G01R 31/382* (2019.01)

(58) Field of Classification Search
USPC .......................................................... 702/132
See application file for complete search history.

(56) References Cited

U.S. PATENT DOCUMENTS

| | | |
|---|---|---|
| 2007/0257659 A1 | 11/2007 | Nomoto et al. |
| 2015/0369532 A1 | 12/2015 | Taguchi et al. |

FOREIGN PATENT DOCUMENTS

| | | | |
|---|---|---|---|
| JP | 2001272422 A | * | 10/2001 |
| JP | 2009-303329 A | | 12/2009 |
| JP | 4628987 B2 | | 2/2011 |
| JP | 2017-093221 A | | 5/2017 |
| JP | 6123741 B2 | | 5/2017 |

* cited by examiner

*Primary Examiner* — Gregory J Toatley, Jr.
*Assistant Examiner* — Denise R Karavias
(74) *Attorney, Agent, or Firm* — Oliff PLC

(57) ABSTRACT

A method of estimating a temperature of a reactor provided in a boost converter disclosed herein, a temperature of a bus bar connected with the reactor and a current flowing in the bus bar are measured; when an absolute value of a DC component ILdc of the measured current exceeds a current threshold Ith, an estimated value of the temperature of the reactor is calculated by adding a first correction value, which depends on the DC component ILdc, to the measured temperature TL and is outputted as an estimated temperature TR; and when the absolute value of the DC component is lower than the current threshold Ith, the estimated value of the temperature of the reactor is calculated by adding a second correction value, which does not depend on the measured current, to the measured temperature and is outputted as the estimated temperature TR.

5 Claims, 8 Drawing Sheets

METHOD OF ESTIMATING TEMPERATURE OF REACTOR

CROSS-REFERENCE TO RELATED APPLICATION

This application claims priority to Japanese Patent Application No. 2017-176821 filed on Sep. 14, 2017, the contents of which are hereby incorporated by reference into the present application.

TECHNICAL FIELD

The disclosure herein relates to a method of estimating a temperature of a reactor provided in a boost converter.

BACKGROUND

An electric vehicle provided with a boost converter that boosts an output voltage of a DC power source to a drive voltage of a motor for running is known. The boost converter used in a driving system of an electric vehicle is typically a chopper converter, and is provided with a reactor. For example, Patent Document 1 (JP 2017-093221 A) describes an electric vehicle provided with such a boost converter. It should be noted that the "electric vehicle" described herein includes a hybrid vehicle provided with both a motor and an engine and a fuel cell vehicle.

An output of the motor in the electric vehicle changes dynamically and frequently according to a driver's accelerator operation. A current that flows in the reactor also changes dynamically and frequently. The reactor generates heat according to the current that flows therein. The reactor experiences drastic heat generations and termination thereof according to the driver's accelerator operation. To prevent overheating of the reactor, an accurate temperature of the reactor needs to be tracked.

The electric vehicle of Patent Document 1 is provided with a temperature sensor that measures a temperature of a bus bar connected to the reactor, instead of a temperature sensor that directly measures the temperature of the reactor. Further, the electric vehicle of Patent Document 1 uses the temperature of the bus bar as an approximate value of the temperature of the reactor. Patent Document 2 (JP 4628987 B) describes a current sensor provided with a temperature sensor for compensating temperature dependency of a current sensor that measures a current of a bus bar. The technique of Patent Document 2 not only compensates for the temperature dependency of the current sensor, but also outputs the measured temperature to a device outside the sensor. By employing the current sensor provided with the temperature sensor and using the temperature of the bus bar as the approximate value of the temperature of the reactor, cost can be suppressed as compared to a case of providing an independent temperature sensor on the reactor.

SUMMARY

Strictly speaking, a temperature of a bus bar connected to a reactor is different from a temperature of the reactor. A technique which enables to more accurately estimate a temperature of a reactor based on a temperature of a bus bar is being demanded.

The disclosure herein discloses a method of estimating a temperature of a reactor used in a boost converter. This estimation method comprises firstly measuring a temperature of a bus bar connected with the reactor and measuring a current flowing in the bus bar. Then, when an absolute value of a DC component (direct current component) of the measured current exceeds a predetermined current threshold, the method calculates an estimated value of the temperature of the reactor, being an estimated temperature for this case, by adding a first correction value to the measured temperature, where the first correction value depends on the DC component. On the other hand, when the absolute value of the DC component is lower than the predetermined current threshold, the method calculates the estimated value of the temperature of the reactor, being the estimated temperature for this case, by adding a second correction value to the measured temperature, where the second correction value does not depend on the measured current. Then, the method outputs the calculated estimated temperature.

The DC component and an AC component (alternating current component) of the current flowing in the reactor are factors that cause temperature increase in the reactor. When the absolute value of the DC component of the flowing current is large, the temperature increase caused by the DC component becomes dominant. The temperature increase caused by the DC component is caused by Joule loss. The Joule loss is known to have a positive correlation with a square of the DC component of the flowing current. Thus, when the absolute value of the DC component of the measured current exceeds the current threshold, the estimated value obtained by adding the first correction value proportionate to the square of the DC component to the temperature of the bus bar (measured temperature thereof) is employed as the estimated temperature of the reactor. On the other hand, when the DC component of the flowing current is small, the AC component of the current becomes dominant as the cause of the temperature increase in the reactor. In this case, a heating value depends on a frequency rather than on an amplitude of AC (alternating current). Thus, in the temperature estimating method disclosed herein, when the absolute value of the DC component of the measured current is lower than the current threshold, the estimated value obtained by adding the second correction value, which does not depend on the measured current, to the temperature of the bus bar (measured temperature thereof) is outputted as the estimated temperature of the reactor. The technique disclosed herein can accurately estimate the temperature of the reactor by switching the correction value to be added to the temperature of the bus bar depending on the absolute value of the DC component of the current flowing in the bus bar.

The first correction value is typically a value that is obtained by multiplying the square of the DC component by a constant, which is based on a ratio (LR/LB) of a power loss (LR) in the reactor to a power loss (LB) in the bus bar. The ratio of the power losses corresponds to a heating value ratio. Due to this, the value that is obtained by multiplying the square of the DC component by the constant which is based on the ratio of the power losses is suitable as the first correction value.

A temperature sensor for measuring the temperature of the bus bar and a current sensor for measuring the current flowing in the bus bar may be provided on a same circuit board. By providing both sensors on the same circuit board, the sensors required for carrying out the aforementioned temperature estimating method can be installed in a small space. Details and further improvements of the technique disclosed herein will be described in Detailed Description below.

DETAILED DESCRIPTION

Figure 1:
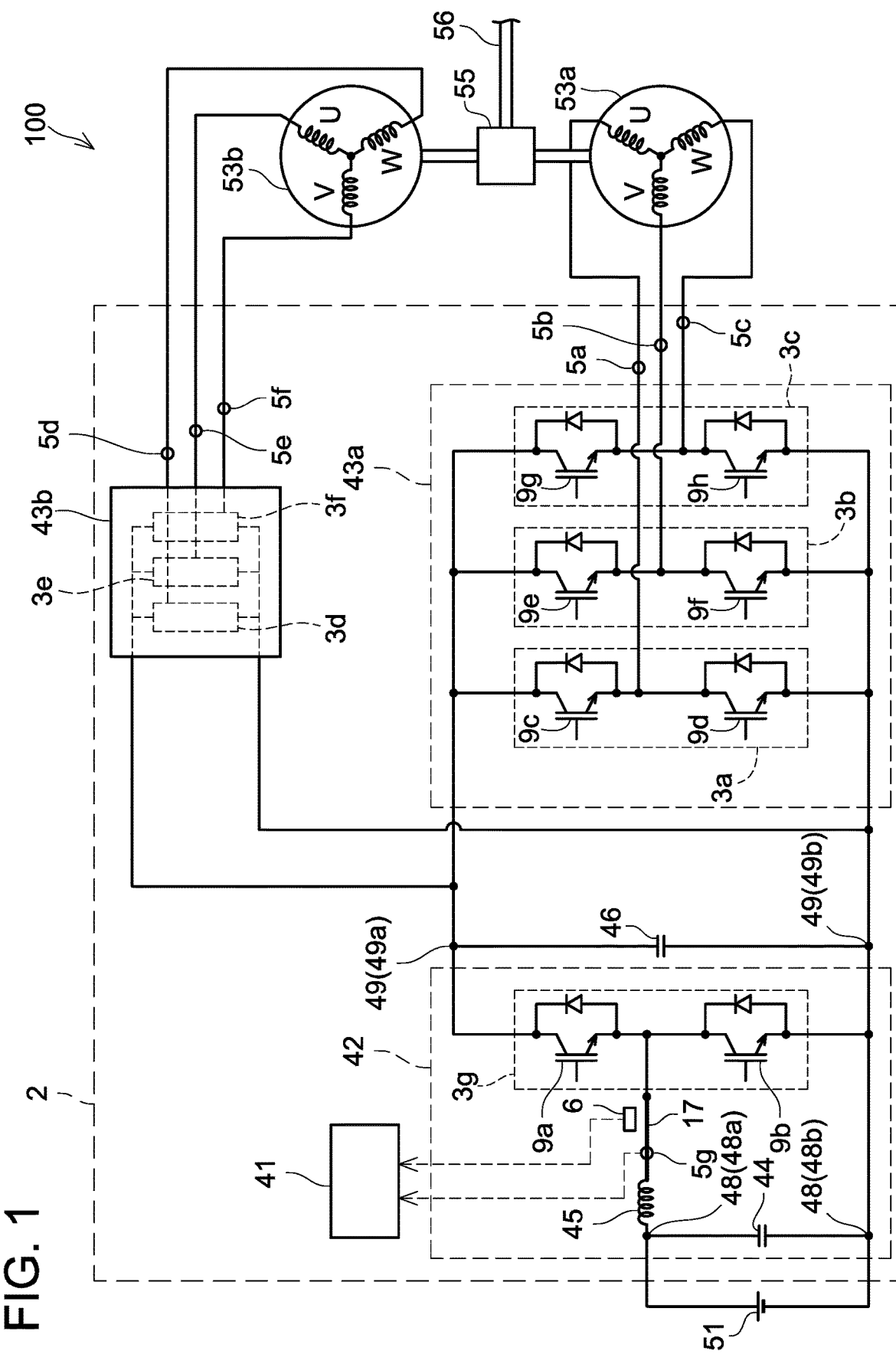
FIG. 1 is a block diagram of a power system of an electric vehicle including a power converter in which a temperature estimating method of an embodiment is implemented.

A temperature estimating method disclosed herein is implemented in an electric power converter installed in an electric vehicle. Firstly, the electric power converter will be described. The electric power converter will be termed "power converter" hereinafter for convenience. The power converter is a device for converting battery power to driving power for a motor for running. FIG. 1 shows a block diagram of a power system of an electric vehicle 100 including a power converter 2. The electric vehicle 100 includes two motors 53a, 53b for running. Due to this, the power converter 2 includes two sets of inverter circuits 43a, 43b. Outputs from the two motors 53a, 53b are combined by a gear set 55 and is transmitted to an axle 56 (that is, driving wheels).

The power converter 2 is connected to a battery 51. The power converter 2 includes a voltage converter circuit 42 that boosts a voltage of the battery 51, and two sets of inverter circuits 43a, 43b for converting boosted DC power to AC (alternating current) power.

The voltage converter circuit 42 is a bidirectional DC-DC converter capable of executing both a boosting operation and a step-down operation. In the boosting operation, a voltage applied to a battery-side terminal can be boosted and outputted to an inverter circuit-side terminal. In the step-down operation, a voltage applied to the inverter circuit-side terminal can be lowered and outputted to the battery-side terminal. Hereinbelow, for the convenience of explanation, the battery-side (low voltage-side) terminal will be termed an input terminal 48, and the inverter circuit-side (high voltage-side) terminal will be termed an output terminal 49. A positive side and a negative side of the input terminal 48 will respectively be termed an input positive terminal 48a and an input negative terminal 48b. A positive side and a negative side of the output terminal 49 will respectively be termed an output positive terminal 49a and an output negative terminal 49b. The terminologies "input terminal 48" and "output terminal 49" are used to simplify the explanation, and since the voltage converter circuit 42 is a bidirectional DC-DC converter, as aforementioned, there also is a case where power flows from the output terminal 49 to the input terminal 48.

The voltage converter circuit 42 is configured of a series circuit of two switching elements 9a, 9b, a filter capacitor 44, a reactor 45, and diodes connected inverse-parallel to the respective switching elements. The reactor 45 has its one end connected to the input positive terminal 48a and the other end thereof is connected to a midpoint of the series circuit. The filter capacitor 44 is connected between the input positive terminal 48a and the input negative terminal 48b. The input negative terminal 48b is connected directly to the output negative terminal 49b. The switching element 9b primarily carries out the boosting operation, and the switching element 9a primarily carries out the step-down operation. The voltage converter circuit 42 of FIG. 1 is called a chopper converter. Since the voltage converter circuit 42 of FIG. 1 is well known, detailed descriptions thereof will be omitted.

A bold line indicated by a reference sign 17 shows a bus bar (second bus bar 17) connected to the reactor 45. A current sensor element 5g and a temperature sensor element 6 are arranged close to the second bus bar 17. The current sensor element 5g, the temperature sensor element 6, and the second bus bar 17 will be described later. A circuit in a rectangle depicted with a broken line as indicated by a reference sign 3g corresponds to a semiconductor module 3g to be described later.

The inverter circuit 43a is configured by three sets of series circuits being connected in parallel, where each series circuit includes two switching elements. Switching elements 9c and 9d, switching elements 9e and 9f, switching elements 9g and 9h respectively configure the series circuits. Each of the switching elements has a diode connected in inverse parallel. A high potential side of the three sets of series circuits is connected to the output positive terminal 49a of the voltage converter circuit 42, and a low potential side of the three sets of series circuits is connected to the output negative terminal 49b of the voltage converter circuit 42. Alternating current (U phase, V phase, W phase) is outputted from respective middle points of the three sets of series circuits. Each of the three sets of series circuits corresponds to one of semiconductor modules 3a, 3b 3c to be described later.

Since a configuration of the inverter circuit 43b is identical to that of the inverter circuit 43a, its specific depiction of circuits is omitted in FIG. 1. Similar to the inverter circuit 43a, the inverter circuit 43b is configured by three sets of series circuits being connected in parallel, where each series circuit includes two switching elements. A high potential side of the three sets of series circuits is connected to the output positive terminal 49a of the voltage converter circuit 42, and a low potential side of the three sets of series circuits is connected to the output negative terminal 49b of the voltage converter circuit 42. Alternating current is outputted from respective middle points of the three sets of series circuits. Hardware configurations corresponding to the respective series circuits are termed semiconductor modules 3d, 3e, 3f.

The inverter circuits 43a, 43b respectively output the three-phase alternating current. Current sensor elements 5a, 5b, 5c are arranged respectively on three-phase output lines of the inverter circuit 43a, and current sensor elements 5d, 5e, 5f are arranged respectively on three-phase output lines of the inverter circuit 43b. The current sensor elements 5a to 5f will be described later. The current sensor elements 5a to 5f are connected to a controller 41 by signal lines, however, a depiction of the signal lines is omitted from the drawings.

A smoothing capacitor 46 is connected in parallel to input terminals of the inverter circuits 43a, 43b. The smoothing capacitor 46 is in other words connected in parallel to the output terminal 49 of the voltage converter circuit 42. The smoothing capacitor 46 removes ripples from an output current of the voltage converter circuit 42.

The switching elements 9a to 9h are transistors for power conversion, and are typically IGBTs (Insulated Gate Bipolar Transistors). The switching elements 9a to 9h may be other transistors such as MOSFETs (Metal Oxide Semiconductor Field Effect Transistors). The power converting transistors may be called power semiconductor elements.

The switching elements 9a to 9h are controlled by the controller 41. The controller 41 determines duty ratios of the respective switching elements 9a to 9h based on an output target command from a host controller that is not shown. The controller 41 sends PWM signals including the determined duty ratios to each of the switching elements 9a to 9h. The host controller determines output targets for the motors 53a, 53b according to vehicle speed, accelerator position, and the like. Since a driver frequently changes the accelerator position of a vehicle, the output targets for the motors 53a, 53b changes frequently as well. When the output targets of the motors 53a, 53b becomes large, the current flowing in the switching elements 9a to 9h and the reactor 45 becomes large, and temperatures of those devices increase. Especially, the reactor 45 has a significantly large heat capacity. As aforementioned, the current sensor element 5g and the temperature sensor element 6 are attached close to the second bus bar 17 connected to the reactor 45. The controller 41 estimates the temperature of the reactor 45 from measurement results of the current sensor element 5g and the temperature sensor element 6. When the estimated temperature becomes high, the controller 41 restricts the current flowing in the reactor 45 to prevent overheating of the reactor 45. Temperature estimation of the reactor 45 will be described later.

Figure 2:
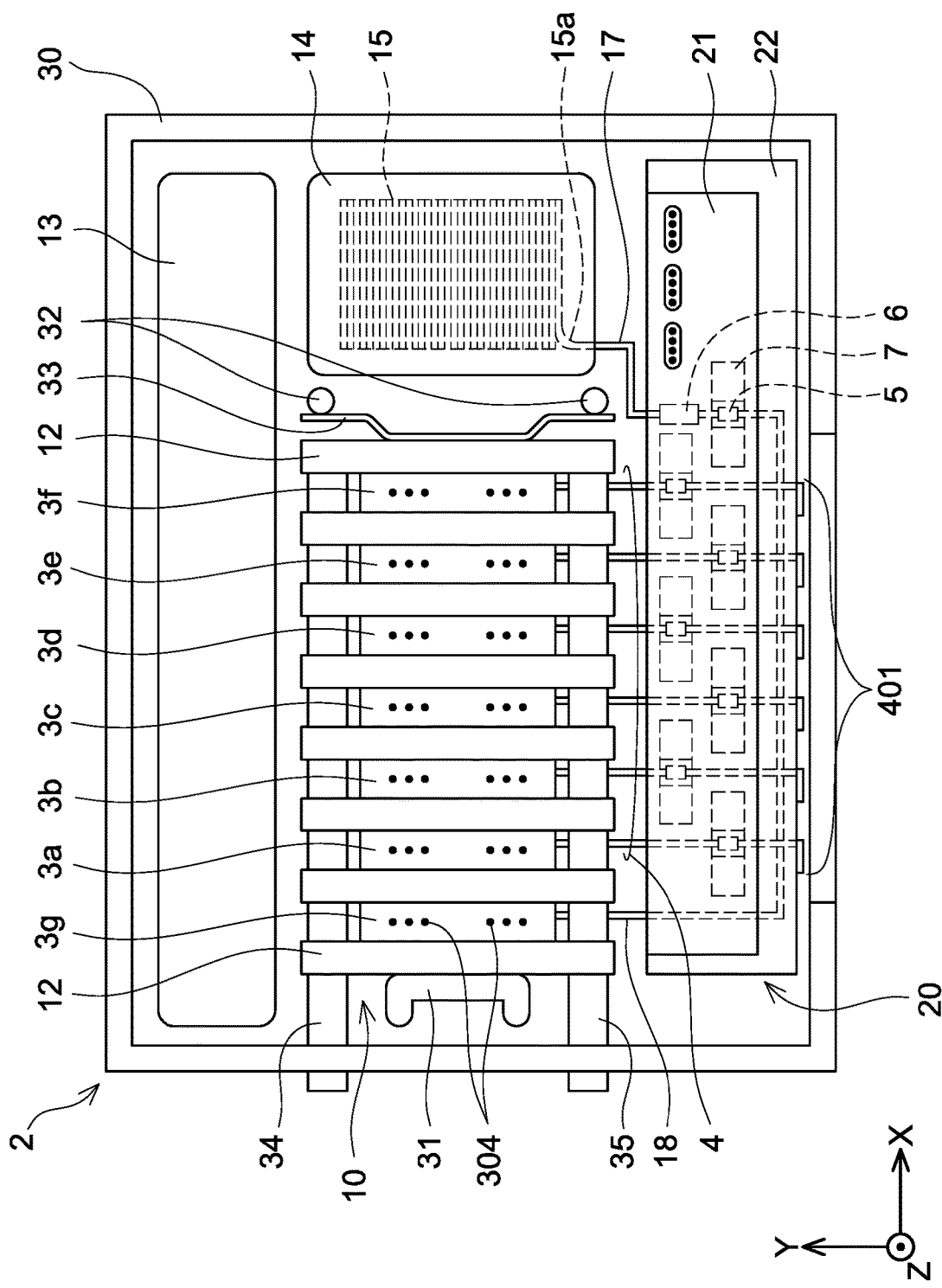
FIG. 2 is a plan view showing a component layout in a housing of the power converter (but omitting a circuit board)
Figure 3:
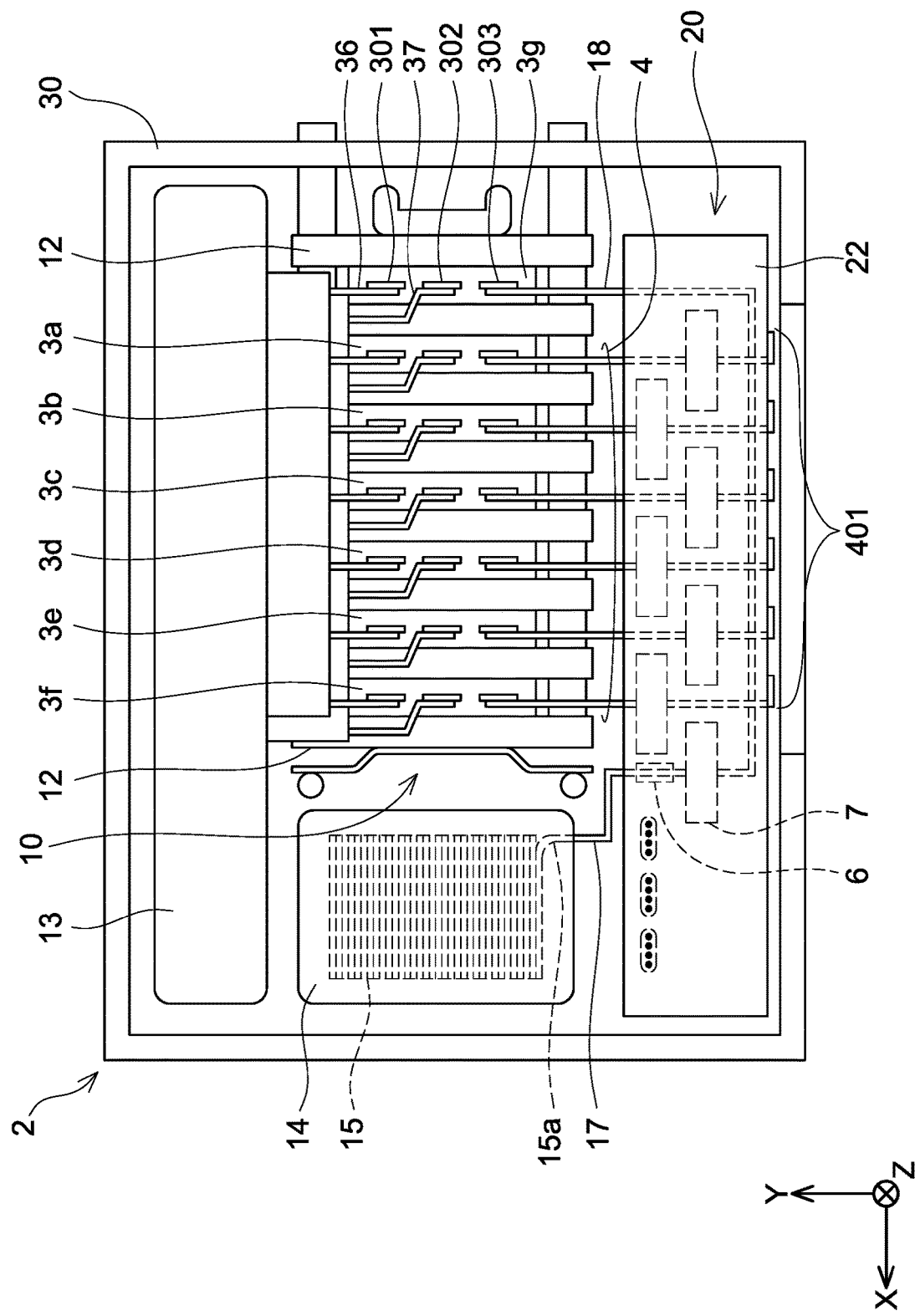
FIG. 3 is a bottom view showing the component layout in the housing of the power converter.
Figure 4:
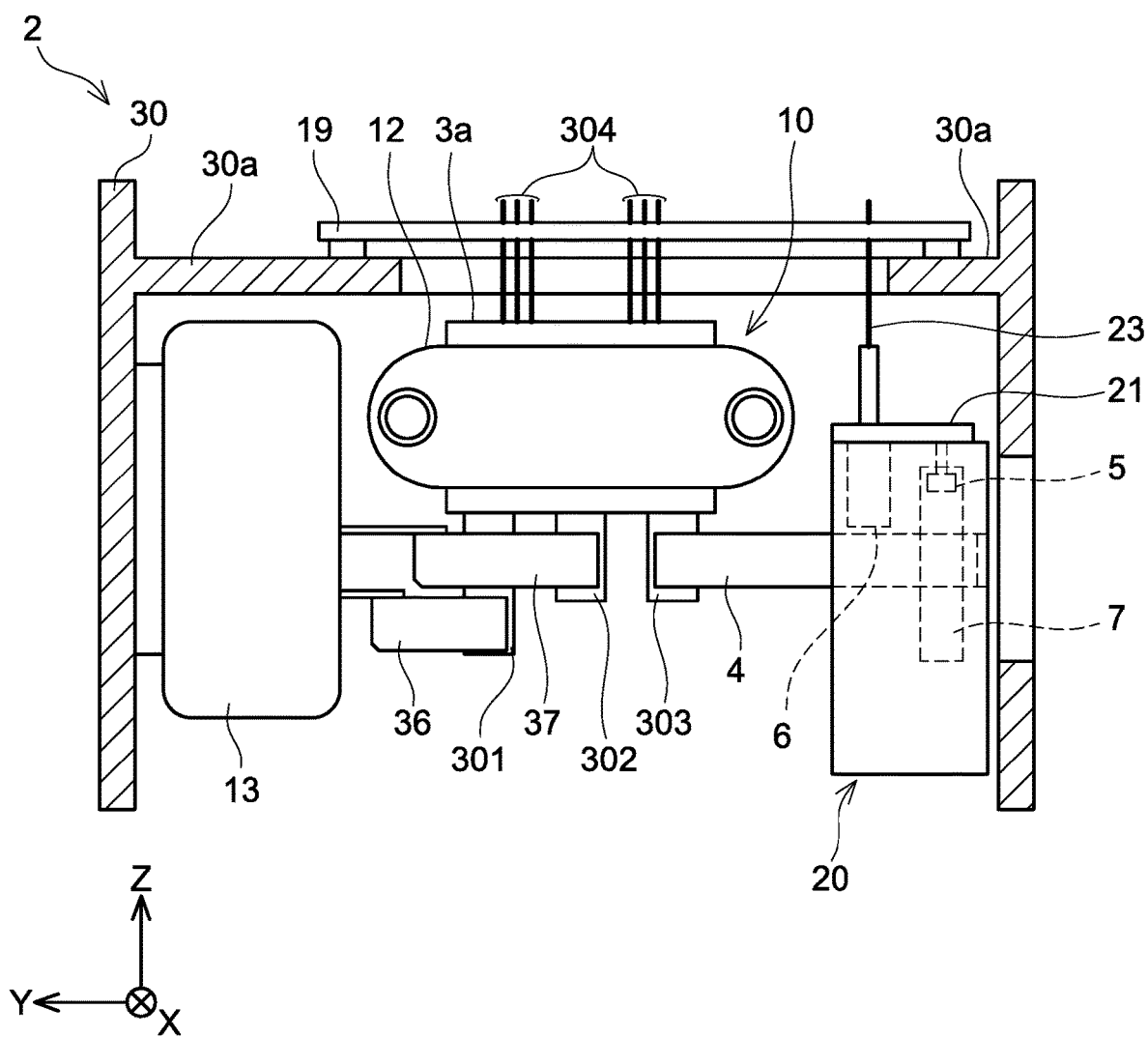
FIG. 4 is a cross-sectional view showing the component layout in the housing of the power converter.

A hardware configuration of the power converter 2 will be described with reference to FIGS. 2 to 6. FIG. 2 is a plan view showing a component layout inside a housing 30 of the power converter 2. For the simplicity of explanation, a Z-axis positive direction in a coordinate system depicted in the drawings will be defined as "above". As will be described later, a control circuit board 19 is arranged at a topmost portion in the housing 30, however, a depiction of the control circuit board 19 is omitted from FIG. 2. Further, a housing partition 30a to be described later is also omitted from FIG. 2. The housing 30 has opened upper and lower sides, and components can be housed therein from above and from below. FIG. 3 is a bottom view seeing the housing 30 from below. FIG. 4 is a cross-sectional view which cut the housing 30 along a YZ plane in the coordinate system depicted in the drawing. In FIG. 4, a depiction of some of components (such as the semiconductor module 3g and the like) is omitted therefrom so that positional relationships of first bus bars 4, the semiconductor modules 3a to 3f, and a terminal unit 20 (to be described later) can be understood easily.

A stacked unit 10, a capacitor unit 13, a reactor unit 14, a terminal unit 20, and the control circuit board 19 are housed in the housing 30 of the power converter 2. As aforementioned, FIG. 2 omits the depiction of the control circuit board 19, and the control circuit board 19 is depicted only in FIG. 4. The stacked unit 10 is a device in which the plurality of semiconductor modules 3a to 3g and a plurality of coolers 12 are stacked. In FIGS. 2 and 3, a reference sign 12 is given to the coolers at both ends of the stacked unit 10, and the reference sign is omitted for other coolers. The plurality of coolers 12 is arranged in parallel, and each semiconductor module is interposed between its adjacent coolers 12. Each of the semiconductor modules has a flat shape, and the plurality of semiconductor modules 3a to 3g is arranged parallel to each other in the stacked unit 10 so that their wider width surfaces face each other. Each of the semiconductor modules 3a to 3g houses two transistors and two diodes, and the two transistors connected in series therein. Each of the diodes is connected in inverse parallel to its corresponding transistor. As aforementioned, the semiconductor modules 3a to 3c are used in the inverter circuit 43a and the semiconductor modules 3d to 3f are used in the inverter circuit 43b. The semiconductor module 3g is used in the voltage converter circuit 42. Hereinbelow, in a case of presenting one of the semiconductor modules 3a to 3g without the need to distinguish it from the others, such will be termed a semiconductor module 3.

The stacked unit 10 is interposed between an inner wall 31 and posts 32 provided in the housing 30 together with a plate spring 33. The inner wall 31 and the posts 32 extend from the housing partition 30a (see FIG. 4). The plate spring 33 presses the stacked unit 10 in a stacking direction of the plurality of semiconductor modules 3. An X direction in the coordinate system in the drawings corresponds to the stacking direction. A coolant supply pipe 34 and a coolant discharge pipe 35 penetrate the plurality of coolers 12. Coolant supplied through the coolant supply pipe 34 is distributed to the plurality of coolers 12. The coolant absorbs heat from the adjacent semiconductor modules 3 while passing through the respective coolers 12. The coolant that had absorbed the heat is discharged from the stacked unit 10 through the coolant discharge pipe 35.

A plurality of control terminals 304 extends from an upper surface of each of the semiconductor modules 3. In FIG. 2, a reference sign 304 is given to only the control terminals of one semiconductor module 3 at the left end, and the reference sign is omitted for the controls terminals of other semiconductor modules 3. The control terminals 304 include control terminals connected to gate terminals of the transistors housed in the semiconductor modules 3 and control terminals of temperature sensors installed in the semiconductor modules 3. As shown in FIG. 4, the control terminals 304 are connected to the control circuit board 19. The control circuit board 19 has mounted thereon a driving circuit for driving the transistors housed in the semiconductor module 3. That is, the controller 41 explained in connection to FIG. 1 is embedded on the control circuit board 19.

As shown in FIG. 3, three power terminals (positive terminal 301, negative terminal 302, midpoint terminal 303) extend from a lower surface of each semiconductor module 3. In FIG. 3, reference signs 301, 302, 303 are given to only the power terminal of the one semiconductor module 3 on the right end, and the reference signs are omitted for the power terminals of other semiconductor modules 3. The positive terminal 301, the negative terminal 302, and the midpoint terminal 303 respectively connect to a high potential side, a low potential side, and the midpoint of the series connection of the two transistors within each semiconductor module 3. The positive terminals 301 of the plurality of semiconductor modules 3 are connected to the capacitor unit 13 by a positive bus bar 36, and the negative terminals 302 thereof are connected to the capacitor unit 13 by a negative bus bar 37. The capacitor unit 13 seals a capacitor element corresponding to the filter capacitor 44 and a capacitor element corresponding to the smoothing capacitor 46 shown in FIG. 1. The positive terminals 301 and the negative terminals 302 of all the semiconductor modules 3 are connected to the capacitor element corresponding to the smoothing capacitor 46 via the positive bus bar 36 and the negative bus bar 37. In FIGS. 2 to 4, connection structures for the filter capacitor 44, the input terminal 48, and the output terminal 49 of FIG. 1 are omitted from depiction.

The first bus bars 4 are connected to each of the midpoint terminals 303 of the semiconductor modules 3a to 3f constituting the inverter circuits 43a, 43b of FIG. 1. The plurality of first bus bars 4 is connected to the terminal unit 20. The terminal unit 20 is a component for connecting power cables leading to the motors. The plurality of first bus bars 4 penetrate through a resin body 22 of the terminal unit 20, and tip ends thereof are configured as connection terminals 401 for connecting the power cables.

A reactor element 15 corresponding to the reactor 45 shown in FIG. 1 is accommodated within the reactor unit 14. A main component of the reactor element 15 is a coil, and one end 15a thereof has the second bus bar 17 connected thereto. Another end of the reactor element 15 (reactor 45 of FIG. 1) is omitted from depiction. The second bus bar 17 is also supported by the terminal unit 20. Inside the body 22 of the terminal unit 20, the second bus bar 17 connects with a third bus bar 18 extending from the midpoint terminal of the semiconductor module 3g. As aforementioned, the semiconductor module 3g is a module used in the voltage converter circuit 42 (see FIG. 1).

Figure 5:
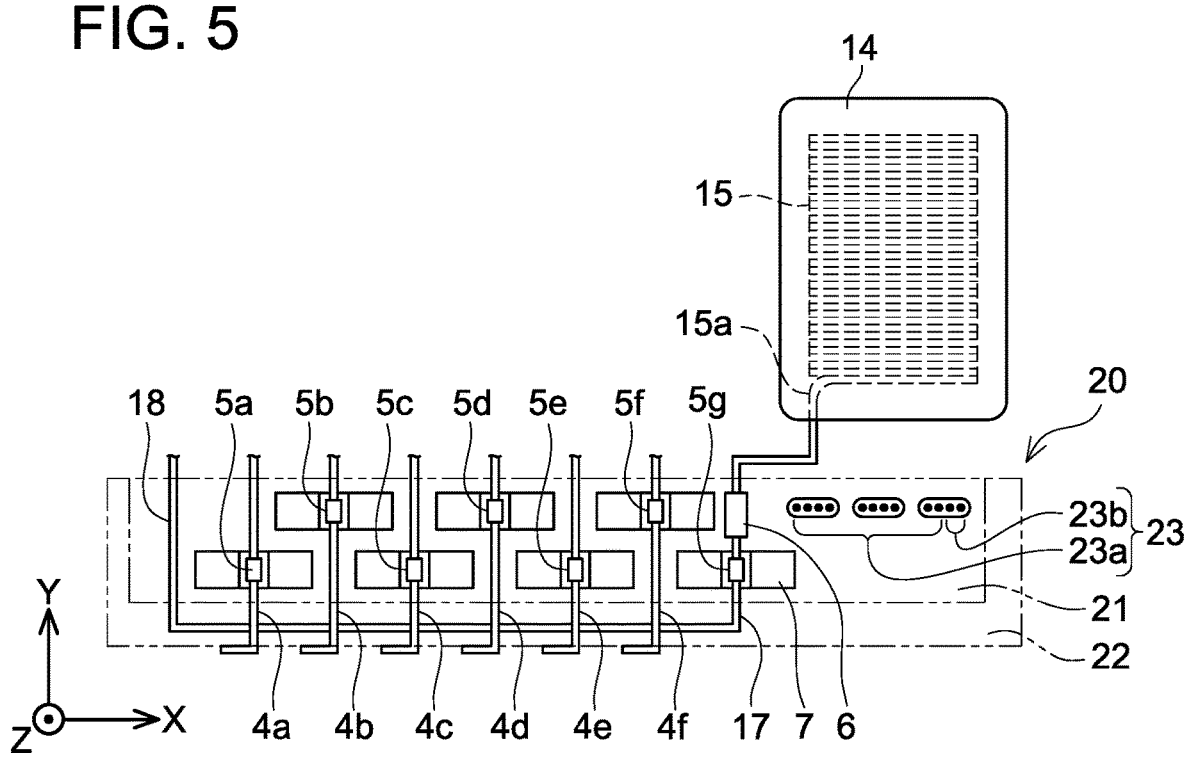
FIG. 5 is a plan view of a terminal unit and a reactor unit.

The terminal unit 20 is provided with a sensor circuit board 21, and the plurality of current sensor elements 5a to 5g and the temperature sensor element 6 are mounted on this sensor circuit board 21. In FIGS. 2 and 5, a reference sign 5 is given to only one current sensor element. Hereinbelow, the plurality of current sensor elements 5a to 5g may simply be termed a plurality of current sensor elements 5.

The plurality of current sensor elements 5 and the temperature sensor element 6 are covered by the body 22 of the terminal unit 20. The body 22 is constituted of resin. Each of the plurality of current sensor elements 5 is arranged to face its corresponding one of the plurality of first bus bars 4 and the second bus bar 17, and is configured to measure current in the bus bar it faces. The current sensor elements 5 are Hall effect sensors and are each provided with a flux collecting core 7. The flux collecting core 7 is a magnetic body having a C shape. The flux collecting core 7 surrounds its corresponding first bus bar 4, and its corresponding current sensor element 5 is located at an open portion of the C shape. The flux collecting core 7 collects magnetic flux generated by the current flowing in the bus bar. The current sensor element 5 measures the magnetic flux which its corresponding flux collecting core 7 has collected. The current flowing in the bus bar and the magnetic flux generated by this current have a unique relationship, and a magnitude of the current flowing in the corresponding bus bar is identified from an intensity of the magnetic flux which the current sensor element 5 (magnetoelectric conversion element) measured.

Figure 6:
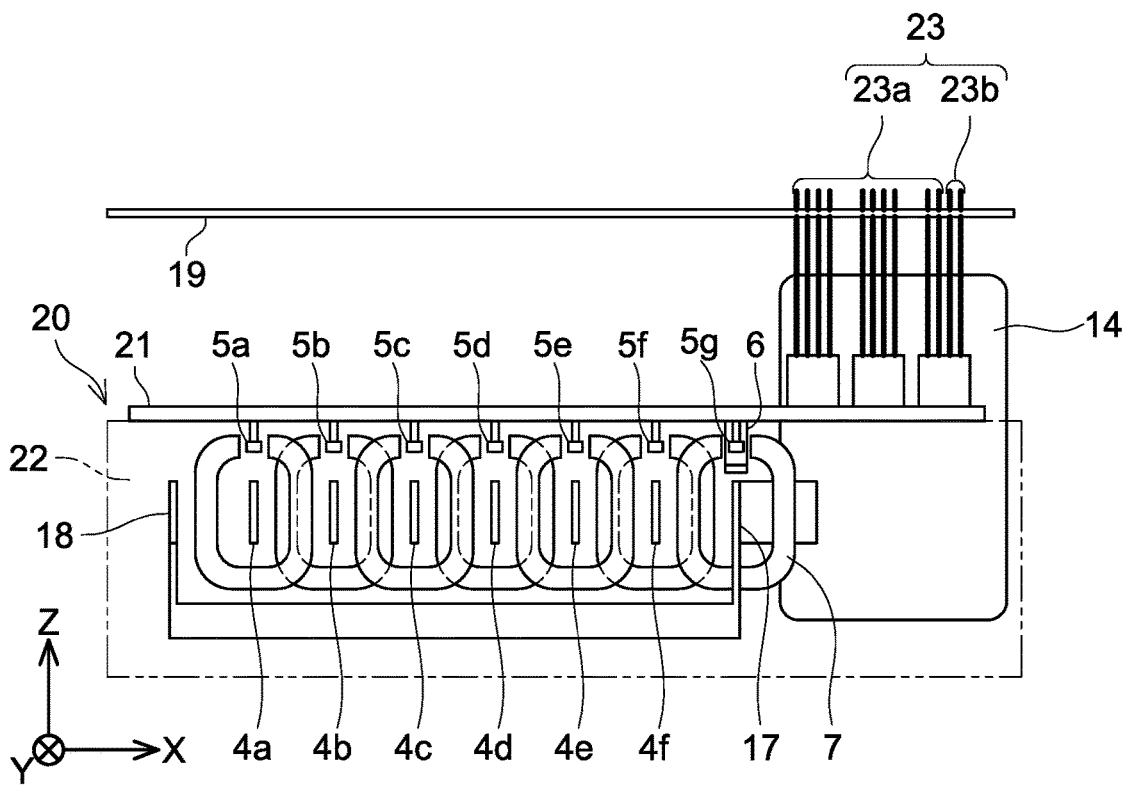
FIG. 6 is a side view of the terminal unit, the reactor unit, and a control circuit board.

The structure of the terminal unit 20 as well as the relationship of the bus bar passing through the terminal unit 20 and the reactor unit 14 will further be described with reference to FIGS. 5 and 6 in addition to FIG. 4. FIG. 5 is a plan view of the terminal unit 20 and the reactor unit 14. FIG. 6 is a side view of the terminal unit 20, the reactor unit 14, and the control circuit board 19. For easier understanding of the internal structure of the terminal unit, FIG. 5 shows the sensor circuit board 21 and the body 22 of the terminal unit 20 by virtual lines, and FIG. 6 shows the body 22 by a virtual line. Further, hereinbelow, the first bus bars respectively corresponding to the semiconductor modules 3a to 3f will be expressed by reference signs 4a to 4f. The first bus bars 4a to 4c transmit the three-phase alternating current outputted by the first inverter circuit 43a, and first bus bars 4d to 4f transmit the three-phase alternating current outputted by the second inverter circuit 43b. In a case of expressing one of the first bus bars 4a to 4f without distinguishing them, such will be termed the "first bus bar 4".

As aforementioned, the plurality of current sensor elements 5 and the temperature sensor element 6 are mounted on the sensor circuit board 21. Each of the current sensor elements 5 is mounted on the sensor circuit board 21 via a spacer. Each of the current sensor elements 5a to 5f measures the current in its corresponding one of the first bus bars 4a to 4f, that is, the output current of the inverter circuits 43a, 43b of FIG. 1. The current sensor element 5g measures the current flowing in the second bus bar 17, that is, the current flowing in the reactor element 15 (reactor 45 of FIG. 1). The temperature sensor element 6 measures the temperature of the second bus bar 17. The second bus bar 17 is connected to the one end 15a of the reactor element 15, and thus it transmits the temperature of the reactor element 15 at high sensitivity. Temperature measurement by the temperature sensor element 6 is used in temperature estimation of the reactor element 15. The temperature estimation of the reactor element 15 will be described later. The temperature sensor element 6 is specifically an infrared thermopile sensor element, for example. In the resin body 22, resin is not filled between the temperature sensor element 6 and the second bus bar 17, and infrared ray emitted by the second bus bar 17 can be received by the temperature sensor element 6.

As shown in FIG. 5, the plurality of first bus bars 4 and the second bus bar 17 are arranged in parallel within the terminal unit 20. Further, the plurality of current sensor elements 5 is arranged in two rows along a direction along which the bus bars are arranged (X direction in the coordinate system in the drawing). The current sensor elements 5b, 5d, 5f that measure the current of the even-numbered bus bars from an end of the arrangements of the first bus bars 4 and the second bus bar 17 are arranged in one of the rows (upper row in FIG. 5), and rest of the current sensor elements 5a, 5c, 5e, 5g are arranged in the other of the rows (lower row in FIG. 5). Further, the temperature sensor element 6 is arranged in the row in which the current sensor element 5g that measures the current of the second bus bar 17 does not belong (upper row in FIG. 5). The temperature sensor element 6 is positioned in a gap between the arrangement of the current sensor elements 5. Each of the plurality of current sensor elements 5 includes the relatively large-sized flux collecting core 7, and the two-row arrangement as aforementioned of the plurality of current sensor elements 5 enables to arrange the plurality of flux collecting cores 7 with high spatial efficiency. Further, according to the aforementioned arrangement, the current sensor element 5 corresponding to each of the bus bars is affected less by influences from magnetic fields (noise magnetic fields) leaking from the collecting cores 7 of its adjacent bus bars.

Furthermore, the aforementioned arrangement also arranges the temperature sensor element 6 with high spatial efficiency. That is, the aforementioned arrangement of the plurality of current sensor elements 5, the plurality of flux collecting cores 7, and the temperature sensor element 6 has a high component mounting density.

A plurality of signal pins 23 extends in parallel from the sensor circuit board 21 to the control circuit board 19. The plurality of signal pins 23 includes a plurality of signal lines 23a configured to transmit measurement data of the plurality of current sensor elements 5 and measurement data of the temperature sensor element 6, and a plurality of common power lines 23b configured to supply power to the plurality of current sensor elements 5 and the temperature sensor element 6 (power positive line and ground line). That is, the power positive line and the ground line (power lines 23b) that are used mutually for the plurality of current sensor elements 5 and the temperature sensor element 6 extend in parallel from the sensor circuit board 21 to the control circuit board 19 together with the plurality of signal lines 23a. The control circuit board 19 has the controller 41 of FIG. 1 mounted thereon, and this controller 41 generates a control signal (gate signal) to be supplied to the switching element of each of the semiconductor module 3 based on the measurement data of the plurality of current sensor elements 5 and the measurement data of the temperature sensor element 6.

The controller 41 generates the control signals for driving the switching elements of the respective semiconductor modules 3 based on the measurement data of the respective current sensor elements 5, such that the current outputted from the midpoint of the respective series connections in the inverter circuits 43a, 43b of FIG. 1 will follow a target value. As aforementioned, the controller 41 estimates the temperature of the reactor element 15 (reactor 45 of FIG. 1) from the temperature of the second bus bar 17 measured by the temperature sensor element 6. When the estimated temperature of the reactor element 15 (reactor 45) is high, the controller 41 generates the control signals for driving the switching elements of the respective semiconductor modules 3 such that the smaller current will flow in the reactor 45 of FIG. 1.

A method of estimating the temperature of the reactor element 15 (reactor 45) will be described. The controller 41 embedded on the control circuit board 19 estimates the temperature of the reactor element 15 (reactor 45 of FIG. 1) using the temperature of the second bus bar 17 measured by the temperature sensor element 6 and the current flowing in the second bus bar 17 measured by the current sensor element 5g. The second bus bar 17 connected to the reactor element 15 is made of copper, and thus has a high heat transfer property. An accurate estimated value can be obtained by estimating the temperature of the reactor element 15 using the temperature of the second bus bar 17. Further, the controller 41 estimates the temperature of the reactor element 15 by using the temperature and the current flowing in the second bus bar 17 (that is, the current flowing in the reactor element 15). Since a loss of the current flowing in the bus bar (reactor) has a positive correlation with temperature increase, the accurate estimated value can be obtained also by estimating it based on the current value.

Figure 7:
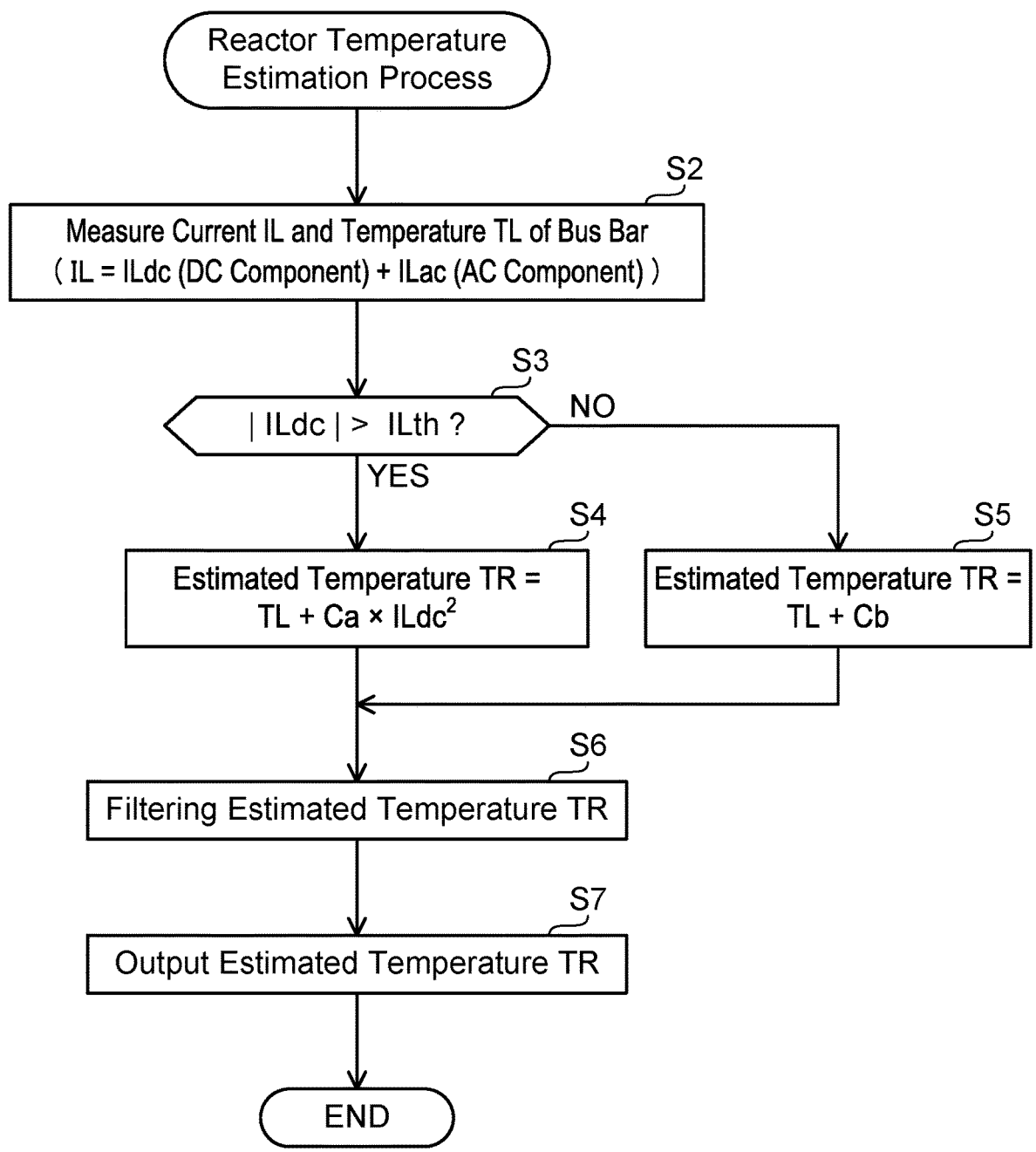
FIG. 7 is a flowchart of a reactor temperature estimation process.

A flowchart of a temperature estimation process is shown in FIG. 7. The controller 41 acquires the temperature TL and the current IL of the second bus bar 17 from the temperature sensor element 6 and the current sensor element 5g (step S2). The current flowing in the reactor element 15 (reactor 45) includes a DC component ILdc and an AC component ILac. The current IL flowing in the second bus bar 17 is expressed as a sum of the DC component ILdc and the AC component ILac. The AC component ILac is caused by current rippling generated by switching operation of the switching elements 9a, 9b in the voltage converter circuit 42, and has a high frequency. The DC component ILdc is obtained by passing the current IL through a low-pass filter.

Next, the controller 41 compares an absolute value of the DC component ILdc with a predetermined current threshold Ith (step S3). When the absolute value of the DC component |ILdc| exceeds the current threshold Ith (step S3: YES), the controller 41 adds a value, which is obtained by multiplying a predetermined constant Ca to a square of the DC component ILdc of the current IL of the second bus bar 17, to the measured temperature TL of the second bus bar 17. The controller 41 sets this result as an estimated temperature TR of the reactor element 15 (reactor 45) (step S4). An equation thereof is as follows:

$$\text{Estimated Reactor Temperature } TR = \\ \text{Bus Bar Temperature } TL + Ca \times \text{DC Component } ILdc^2 \quad \text{(Equation 1)}$$

The sign Ca in the above equation is a predetermined proportionality constant. The proportionality constant Ca will be described later.

On the other hand, when the absolute value of the DC component |ILdc| is lower than the current threshold Ith (step S3: NO). The controller 41 sets a value which is obtained by adding a predetermined constant Cb to the measured temperature TL of the second bus bar 17 as the estimated temperature of the reactor element 15 (reactor 45) (step S5). An equation thereof is as follows:

$$\text{Estimated Reactor Temperature } TR = \text{Bus Bar Temperature } TL + Cb \text{ (where } Cb \text{ is a constant)} \quad \text{(Equation 2)}$$

Next, the controller 41 passes the estimated temperature TR obtained in step S4 or S5 through a low-pass filter (step S6), and outputs a result thereof (step S7). The low-pass filter may, for example, be a moving average of the most recent 10 values of the estimated temperature TR in the past.

(Equation 1) and (Equation 2) will be described. The DC component ILdc and the AC component ILac of the flowing current IL influence the temperature increase in the reactor element 15 (reactor 45). When the absolute value of the DC component ILdc is large, the DC component ILdc dominantly influence the temperature increase. The temperature increase caused by the DC component ILdc is caused by Joule loss. The Joule loss is known to have a positive correlation with the square of the DC component ILdc of the current. Thus, when the absolute value of the DC component ILdc of the current flowing in the second bus bar 17 (reactor element 15) exceeds the current threshold Ith, the estimated value obtained by adding a first correction value, which depends on the square of the DC component ILdc, to the temperature TL of the bus bar 17 (measured temperature TL thereof) is employed as the estimated temperature TR of the reactor. The second term on the right-hand side of (Equation 1) (Ca×DC Component $ILdc^2$) corresponds to the first correction value. The sign Ca is the predetermined proportionality constant. The proportionality constant Ca is obtained as follows.

Heat generation caused by the DC component of the current ILdc is caused by Joule heat generated by the bus bar and the reactor. The Joule heat is equivalent to a value that multiplies the square of the DC component by an internal resistance. Joule heat Ja of the second bus bar 17 is expressed by Ja=Ra×[DC Component $ILdc^2$]. Here, a sign Ra is an internal resistance of the second bus bar 17. On the other hand, Joule heat Jb of the reactor element 15 is expressed by Jb=[Rb×DC Component $ILdc^2$]. Here, a sign Rb is an internal resistance of the reactor element 15. A Joule heat ratio Jb/Ja corresponds to a ratio of a heating value of the second bus bar 17 and a heating value of the reactor element 15. As such, the constant Ca in the second term on the right-hand side of (Equation 1) becomes Ca=Rb/Ra. The Joule heat ratio Jb/Ja corresponds to a ratio of a power loss in the reactor element 15 to a power loss in the second bus bar 17.

On the other hand, when the DC component of the current ILdc is small, the AC component of the current ILac dominantly influence the temperature increase in the reactor element 15. In this case, the heating value depends on a frequency rather than on an amplitude of the alternating current. Thus, when the absolute value of the DC component ILdc is lower than the current threshold Ith, the estimated value obtained by adding a second correction value, which does not depend on the current IL flowing in the bus bar 17 (measured current IL), to the temperature TL of the bus bar 17 (measured temperature TL) is employed as the estimated temperature TR of the reactor. The constant Cb at the second term on the right-hand side of (Equation 2) corresponds to the second correction value. The constant Cb may vary depending on a switching frequency.

As aforementioned, the accurate estimated temperature of the reactor element 15 is obtained by switching the equation for obtaining the estimated temperature of the reactor element 15 (reactor 45) depending on a magnitude of the DC component ILdc of the current IL flowing in the second bus bar 17.

Figure 8:
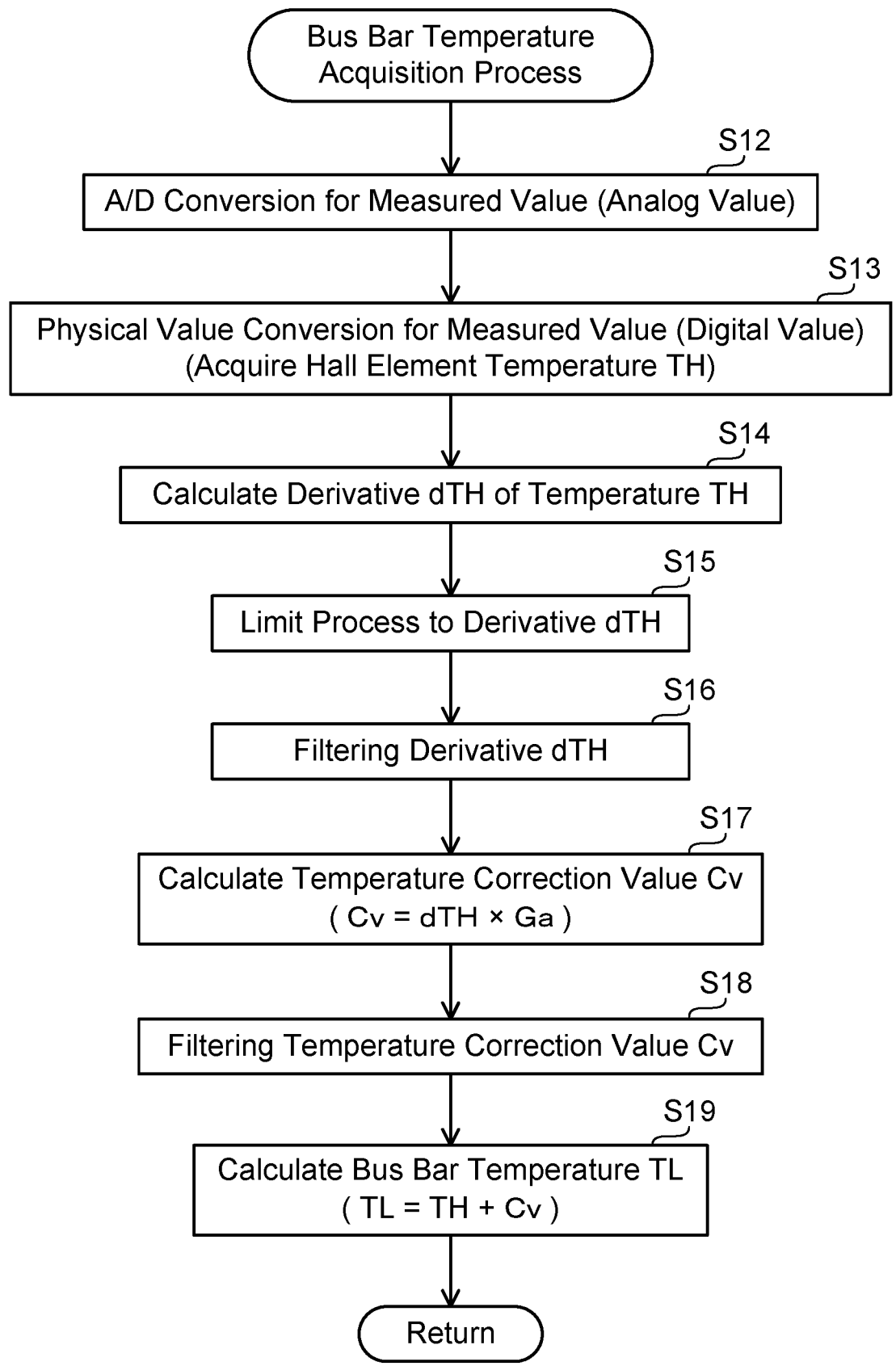
FIG. 8 is a flowchart of a bus bar temperature acquiring process.

Some features related to the technique described in the embodiment will be described. The current sensor element 5g of the embodiment corresponds to an example of a current sensor configured to measure the current flowing in the second bus bar 17 connected to the reactor element 15. The current sensor element 5g is typically a Hall effect sensor. The temperature sensor element 6 corresponds to an example of a temperature sensor configured to measure the temperature of the second bus bar 17. The temperature sensor may be integrated in the current sensor. For example, the current sensor element may be a Hall effect sensor, and the bus bar temperature may be obtained from a temperature sensor integrated in the Hall effect sensor. An example of a process of obtaining the temperature TL of the second bus bar 17 from a measurement value of the temperature sensor integrated in the Hall effect sensor is shown in FIG. 8.

An output of the temperature sensor element 6 is an analog value, and is outputted for example as a voltage value which changes according to the temperature. In step S12, the controller 41 converts the analog value outputted by the temperature sensor element 6 to a digital value (performs A/D conversion). Then, the controller 41 converts the digitally-converted measurement value (voltage) to a Hall effect sensor temperature TH being a physical value (step S13). Next, the controller 41 calculates a derivative dTH of the Hall effect sensor temperature TH (step S14). The derivative is obtained by dividing a difference of a currently-measured Hall effect sensor temperature TH and a previously-measured Hall effect sensor temperature TH by a measurement sampling time.

Next, the controller 41 performs a limit process on the obtained derivative dTH (step S15). The limit process is a process of substituting the derivative dTH by an upper limit value if the derivative dTH exceeds the upper limit value, and substituting the derivative dTH by a lower limit value if it is lower than the lower limit value. The limit process avoids the derivative from becoming an extreme value.

Next, the controller 41 subjects the derivative dTH to a low-pass filter (step S16). The low-pass filter is typically a moving average of time series data of the derivative dTH. Then, the controller 41 calculates a temperature correction value Cv (step S17). The temperature correction value Cv is obtained by an equation: Cv=dTH×Ga (where Ga is a predetermined gain). The controller 41 also subjects the temperature correction value Cv to a low-pass filter (step S18). Finally, the controller 41 obtains the bus bar temperature TL by an equation: Bus Bar Temperature TL=Hall Effect Sensor Temperature TH+Temperature Correction Value Cv (step S19).

The derivative dTH of the Hall effect sensor temperature TH corresponds to a temperature increasing rate of the Hall effect sensor temperature TH. The process in the flowchart of FIG. 8 means to obtain the bus bar temperature TL by adding a correction to the Hall effect sensor temperature TH using the temperature increasing rate. By taking the temperature increasing rate into consideration, the accurate bus bar temperature TL can thereby be obtained.

Figure 9:
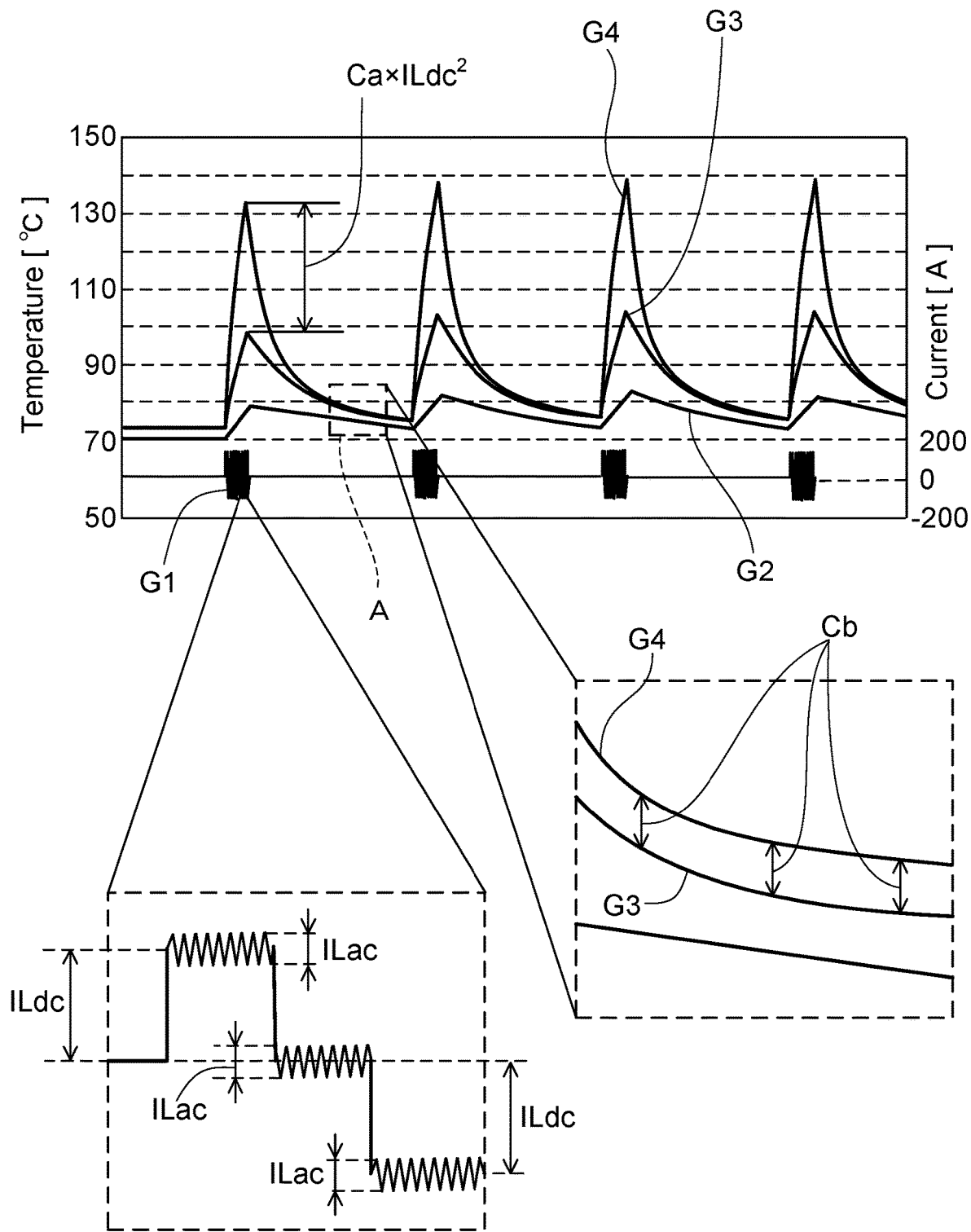
FIG. 9 is a graph showing example results of temperature estimation.

FIG. 9 shows an example of results of the processes of FIGS. 7 and 8. A graph G1 shows the current flowing in the bus bar 17 (reactor), and a vertical axis on the right side indicates the current. A graph G2 shows the measurement value of the temperature sensor integrated in the Hall effect sensor. That is, the graph G2 shows the Hall effect sensor temperature TH. A vertical axis on the left side indicates the temperature. A graph G3 shows the bus bar temperature TL obtained based on the Hall effect sensor temperature TH. The graph G3 is obtained from the graph G2 (Hall effect sensor temperature TH) based on the process in the flowchart of FIG. 8. A graph G4 shows the estimated reactor temperature TR obtained based on the process of FIG. 7.

A partially enlarged view of the current flowing in the bus bar (reactor) (graph G1) is shown on the left lower side. The current flowing in the bus bar (reactor) is the sum of the DC component ILdc and the AC component ILac.

An enlarged view of a range indicated by a broken line A is shown on the right lower side. In a range where the DC component ILdc of the current flowing in the reactor is large, a difference between the bus bar temperature TL (graph G3) and the estimated reactor temperature TR (graph G4) is set to "Ca×ILdc$^2$". In a range where the DC component ILdc is small, the difference between the bus bar temperature TL (graph G3) and the estimated reactor temperature TR (graph G4) is set to "Cb (constant)".

As shown by steps S3 to S5 of FIG. 7, the calculation equation for the estimated reactor temperature TR is different in the range where the DC component ILdc is large and the range where the DC component ILdc is small. However, since the estimated temperature TR is subjected to the low-pass filter in step S6, the estimated temperature TR changes continuously even at a boundary between the range where the DC component ILdc is large and the range where the DC component ILdc is small.

Some other features related to the technique described in the embodiment will be described. The temperature estimation process of the reactor element 15 may be executed by the controller 41 mounted on the control circuit board 19, or a microchip may be mounted on the sensor circuit board 21 on which the sensor elements are mounted, and the temperature estimation process may be executed by this microchip.

In the embodiment, the reactor temperature estimation process is applied to the power converter 2 provided with the boost converter circuit and the inverter circuits. The temperature estimation process disclosed herein may be applied to various types of boost converters including reactors.

Specific examples of the teachings herein have been described in detail, however, these are mere exemplary indications and thus do not limit the scope of the claims. The art described in the claims includes modifications and variations of the specific examples presented above. Technical features described in the description and the drawings may technically be useful alone or in various combinations, and are not limited to the combinations as originally claimed. Further, the art described in the description and the drawings may concurrently achieve a plurality of aims, and technical significance thereof resides in achieving any one of such aims.

What is claimed is:

1. A method of estimating a temperature of a reactor included in a boost converter, the method comprising:

measuring a temperature of a bus bar connected with the reactor and measuring current flowing in the bus bar;

when an absolute value of a DC component of the measured current exceeds a predetermined current threshold, calculating an estimated value of the temperature of the reactor by adding a first correction value to the measured temperature, the first correction value depending on the DC component;

when the absolute value of the DC component is lower than the predetermined current threshold, calculating the estimated value of the temperature of the reactor by adding a second correction value to the measured temperature, the second correction value not depending on the measured current; and outputting the calculated estimated temperature.

2. The method of claim 1, wherein the first correction value is proportionate to a square of the DC component.

3. The method of claim 2, wherein the first correction value is calculated by multiplying a constant by the square of the DC component, the constant being set based on a ratio of a power loss in the reactor to a power loss in the bus bar.

4. The method of claim 1, wherein a temperature sensor for measuring the temperature of the bus bar and a current sensor for measuring the current flowing in the bus bar are provided on a same circuit board.

5. The method of claim 2, wherein the second correction value depends on a switching frequency of a switching element included in the boost converter.

* * * * *